US009448261B2

(12) United States Patent
Weller

(10) Patent No.: US 9,448,261 B2
(45) Date of Patent: Sep. 20, 2016

(54) SYSTEMS AND METHODS FOR REDUCING ATTENUATION IN CURRENT TRANSDUCERS

(71) Applicant: General Electric Company, Schenectady, NY (US)

(72) Inventor: Nathan Andrew Weller, Gardnerville, NV (US)

(73) Assignee: General Electric Company, Schenectady, NY (US)

( * ) Notice: Subject to any disclaimer, the term of this patent is extended or adjusted under 35 U.S.C. 154(b) by 180 days.

(21) Appl. No.: 14/251,432

(22) Filed: Apr. 11, 2014

(65) Prior Publication Data

US 2015/0293157 A1     Oct. 15, 2015

(51) Int. Cl.
*G01R 15/18*     (2006.01)
*G01R 19/00*     (2006.01)
*G01R 35/00*     (2006.01)
*G01R 35/02*     (2006.01)

(52) U.S. Cl.
CPC ......... *G01R 19/0092* (2013.01); *G01R 15/183* (2013.01); *G01R 35/005* (2013.01); *G01R 35/02* (2013.01); *G01R 15/186* (2013.01)

(58) Field of Classification Search
CPC ....... G01R 1/22; G01R 15/18; G01R 15/183
See application file for complete search history.

(56) References Cited

U.S. PATENT DOCUMENTS

| 5,180,970    | A  * | 1/1993  | Ross ...................... G01R 33/07 324/117 H |
| 5,828,282    | A  * | 10/1998 | Tiemann ............... H01F 27/365 336/174 |
| 6,191,673    | B1 * | 2/2001  | Ogura ..................... H01F 27/38 336/174 |
| 8,253,299    | B1 * | 8/2012  | Rittenhouse ............. B62M 6/65 310/257 |
| 8,421,442    | B2   | 4/2013  | Younsi et al. |
| 8,502,554    | B2 * | 8/2013  | Wilson ................. G01R 31/343 324/127 |
| 9,117,588    | B2 * | 8/2015  | Gross ....................... H01F 27/30 |
| 9,123,511    | B2 * | 9/2015  | Young ................. H01J 37/3441 |
| 2011/0116197 | A1 * | 5/2011  | Zylstra ................. G01R 15/183 361/42 |
| 2011/0221437 | A1 * | 9/2011  | Stockum ............. G01R 33/072 324/252 |
| 2013/0076389 | A1 * | 3/2013  | Wilson ................. G01R 31/343 324/765.01 |
| 2013/0128396 | A1 * | 5/2013  | Danesh .................. G01R 19/00 361/45 |
| 2013/0154629 | A1 * | 6/2013  | Gudel .................. G01R 15/185 324/225 |
| 2013/0234722 | A1   | 9/2013  | Younsi et al. |

OTHER PUBLICATIONS

U.S. Appl. No. 13/929,642, filed Jun. 27, 2013, Dan Tho Lu.
U.S. Appl. No. 14/073,727, filed Nov. 6, 2013, Ashok Kumar Yannam.

* cited by examiner

*Primary Examiner* — Tung X Nguyen
*Assistant Examiner* — Dominic Hawkins
(74) *Attorney, Agent, or Firm* — Fletcher Yoder, P.C.

(57) ABSTRACT

A device includes a first axial ring, a first radial ring disposed below the first axial ring and a second radial ring disposed below the first axial ring. The first radial ring and the second radial ring are spaced apart in a radial direction. The device also includes an electrically non-conductive isolating ring disposed between the first axial ring and the first radial ring and a current sensor disposed between the first radial ring and the second radial ring. Further, the device includes a second axial ring disposed below the first radial ring, the second radial ring, and the current sensor. The first axial ring, the first radial ring, the second radial ring, and the second axial ring form a magnetic shield and an electrically conductive shell around the current sensor. The isolating ring disrupts the electrical continuity of the electrically conductive shell.

20 Claims, 8 Drawing Sheets

SYSTEMS AND METHODS FOR REDUCING ATTENUATION IN CURRENT TRANSDUCERS

BACKGROUND

The subject matter disclosed herein relates to systems and methods for reducing attenuation in current transducers. More specifically, the subject matter disclosed herein relates to reducing attenuation caused by magnetic shielding around a current sensor within a current transducer.

Current transducers may be used for a variety of purposes, such as measuring an actual current input and/or output for devices and/or systems. A current transducer generally includes a current sensor paired with circuitry to receive, and in some embodiments, transform the input and/or output measured by the sensor. In certain applications, the current transducer may measure small currents, which create small magnetic fields. In these applications, the current sensor maybe surrounded by magnetic materials that reduce interference by external magnetic fields that could obscure the small magnetic fields. The magnetic materials may be highly permeable and continuous around the sensor to provide the most effective magnetic shield.

Since magnetic materials tend to have a high conductance, the magnetic materials may also create an electrically conductive shell around the current sensor. However, this electrically conductive shell can interfere with and attenuate the small magnetic fields generated by the small currents, which the current sensor is intended to measure. In some existing current transducers, the potting material used to stabilize the internal components of the device may flow in between the pieces of magnetic material, electrically isolating them. Because the potting material may generally interrupt the electrically conductive shell, the current sensor may operate correctly, or at least well enough. In other current transducers, because the magnetic materials are composed of discrete parts, they might not form an electrically conductive shell while still forming the magnetic shield. For other current transducers experiencing attenuation, systems may require calibration to operate properly. In sum, there exists a need for improved current transducers that operate with reduced attenuation and overcome the above-noted problems present in the prior art.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a device includes a first axial ring, a first radial ring disposed below the first axial ring and a second radial ring disposed below the first axial ring. The first radial ring and the second radial ring are spaced apart in a radial direction. The device also includes an electrically non-conductive isolating ring disposed between the first axial ring and the first radial ring and a current sensor disposed between the first radial ring and the second radial ring. Further, the device includes a second axial ring disposed below the first radial ring, the second radial ring, and the current sensor. The first axial ring, the first radial ring, the second radial ring, and the second axial ring form a magnetic shield and an electrically conductive shell around the current sensor. The isolating ring disrupts the electrical continuity of the electrically conductive shell.

In a second embodiment, a method of assembly includes disposing a first radial ring adjacent to a current sensor and disposing a second radial ring adjacent to the current sensor, such that the first radial ring and the second radial ring are on opposite sides of the current sensor. The method of assembly also includes disposing an isolating ring on top of the first radial ring. Further, the method of assembly includes disposing a first axial ring on top of the first radial ring, the current sensor, and the isolating ring; and disposing a second axial ring below the first radial ring, the current sensor, and the second radial ring.

In a third embodiment, a system includes a device. The device in turn includes a housing and a first axial ring disposed in the housing. A first radial ring and a second radial ring are disposed on top of the first axial ring, such that the first radial ring and the second radial ring are spaced apart in a radial direction. A current sensor is disposed in between the first radial ring and the second radial ring. Further, an isolating ring is disposed on top of the first radial ring, and a second axial ring is disposed on top of the first radial ring, the current sensor, and the isolating ring. The device also includes a lid disposed above the second axial ring and coupled to the housing and a plurality of connector pins electrically coupled to the current sensor and disposed in the housing. The lid and the housing form a non-conductive shell. The first axial ring, the first radial ring, the second radial ring, and the second axial ring form a magnetic shield and an electrically conductive shell around the current sensor. The isolating ring disrupts the electrical continuity of the electrically conductive shell.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
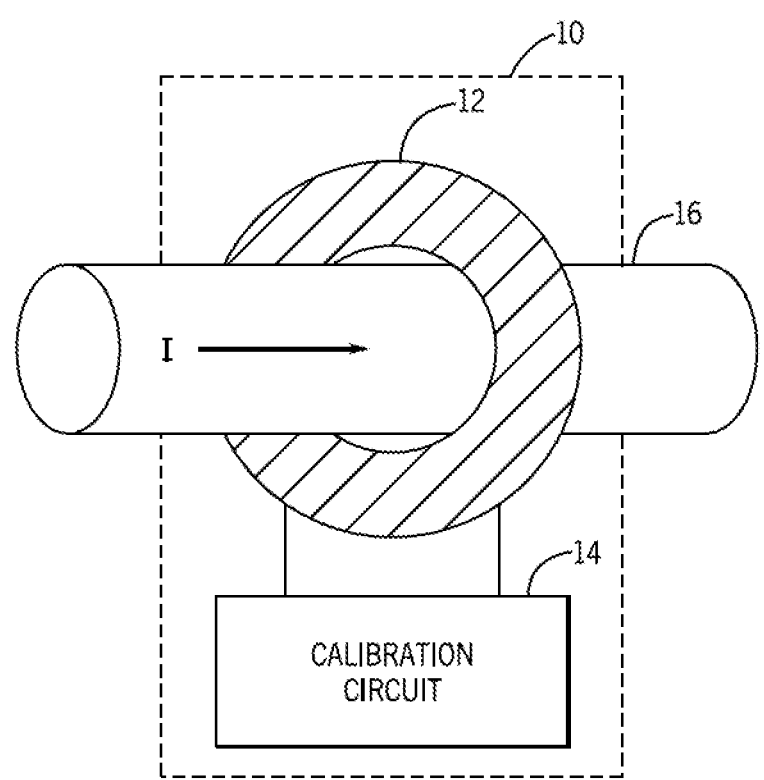
FIG. 1 is a schematic diagram illustrating an embodiment of a current transducer calibration system, in accordance with aspects of the present disclosure.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Current transducers may be used for a variety of purposes including measuring an actual current input and/or output of a device (e.g., generator, motor, etc.), determining an amount of leakage current within a device, or the like. Because current transducers may be used to measure very small currents, current transducers may include materials that create a magnetic shield around a current sensor within the current transducer. This magnetic shield may reduce interference by external magnetic fields that could affect the small magnetic fields caused by the small currents the current transducer is intended to measure, thus allowing for increased reliability of the measurements made by the current transducer.

However, the magnetic materials may have a high conductance and as such may create an electrically conductive shell around the current sensor. This electrically conductive shell may attenuate the small magnetic fields caused by the small currents the current transducer is intended to measure. In some transducers, potting material used to stabilize internal components of the device may seep into spaces between the magnetic materials and partially disrupt the continuity of the electrically conductive shell, thus reducing attenuation. In other current transducers, the magnetic materials may be implemented discretely so as to not form an electrically conductive shell, while still forming a magnetic shield. Other solutions may include calibration of the signals received from the transducer. However, these techniques may add undesirable cost and/or complexity to the transducer and the system monitoring the transducer. Additionally, these techniques may not be easily repeatable, thus reducing the overall reliability of transducers built using these techniques.

Accordingly, present embodiments relate to consistently and repeatedly reducing attenuation caused by magnetic materials in current transducers. The embodiments described herein include utilizing an isolating ring that may be disposed between two or more pieces of the magnetic materials of a transducer. The isolating ring may uniformly disrupt the continuity of the electrically conductive shell, reducing attenuation of the magnetic fields associated with the currents the current transducer is intended to measure. By using a component to disrupt the electrically conductive shell and reduce attenuation, the present current transducers may have increased reliability and accuracy over time and can be built in a more consistent manner.

By way of introduction, FIG. 1 depicts a schematic diagram of a current transducer calibration system (current transducer 10). The current transducer 10 may include a current sensor 12 and a calibration circuit 14. The current sensor 12 may be a current transformer that employs a toroidal inductor and a ferrite core to sense a coupling magnetic field from an electric current conducting through a conductor. The calibration circuit 14 may be used to calibrate the measurement output of the current transducer 10.

In one embodiment, the current sensor 12 may be coupled around a conductor 16, which may conduct current I. Here, the toroidal inductor may produce a current or voltage output (i.e., measurement output of the current sensor 12) that is proportional to the amplitude of the current I. Although FIG. 1 depicts the current sensor 12 as being coupled around a single conductor 16, it should be noted that the current sensor 12 may be coupled around multiple conductors. As such, the current sensor 12 may measure the net current with respect to all of the conductors being monitored by the current sensor 12.

As will be appreciated by one skilled in the art, the current sensor 12 may include a single sensor core and a single coil wound around the entire circumference of the sensor core. However, in other embodiments, the coil may be wound around a significant portion of the circumference of the sensor core, such that the winding substantially covers the circumference of the sensor core. In still other embodiments, multiple coils may be wound around the sensor core, such that the multiple windings substantially or entirely cover the circumference of the sensor core. Finally, in yet other embodiments, the sensor core may be made of discrete pieces that abut one another, and multiple coils may be wound the discrete pieces to substantially or entirely cover the circumference of the sensor core.

Generally, the measurement output of the current sensor 12 (i.e., the measurement output of the current transducer 10) may include a phase shift (e.g., degrees) between the measurement output and the current I. The amount of the phase shift may depend on the intrinsic inductance, capacitance, and/or resistance within the current transducer 10 (i.e., within the current sensor 12 and the calibration circuit 14) and an impedance of any load circuit coupled to the current transducer 10. Moreover, since each individual current transducer 10 may have different intrinsic inductance, capacitance, and/or resistance properties, each current transducer 10 may have different sensitivities or tolerances. That is, each current transducer 10 may output a slightly different measurement value for the same input current due to the different sensitivities of each current transducer 10. For example, one current transducer 10 may output 1 volt when 100 amps of current are conducting via the conductor 16 while another current transducer 10 may output 1.1 volts when the same 100 amps of current are conducting via the conductor 16. The sensitivity of each current transducer 10 may vary due to a variety of factors including a number of winding turns on the toroidal inductor, an intrinsic resistance of the toroidal inductor, the resistance of a load circuit, and the like.

Keeping the foregoing in mind, the calibration circuit 14 may control the phase shift and/or the sensitivity properties of the current transducer 10. That is, the calibration circuit 14 may adjust the phase shift and/or the sensitivity properties of the output of the current transducer 10 to match some desired phase shift and/or sensitivity property. In one embodiment, the calibration circuit 14 may be used to calibrate different current transducers 10, such that the measurement output for each current transducer 10 may be substantially similar or equal (e.g., less than 1%). For instance, the calibration circuit 14 may adjust the phase shift and sensitivity properties of the measurement output of multiple current transducers 10 such that each current transducer 10 outputs substantially similar or equal values for various input currents (e.g., current I).

Figure 2:
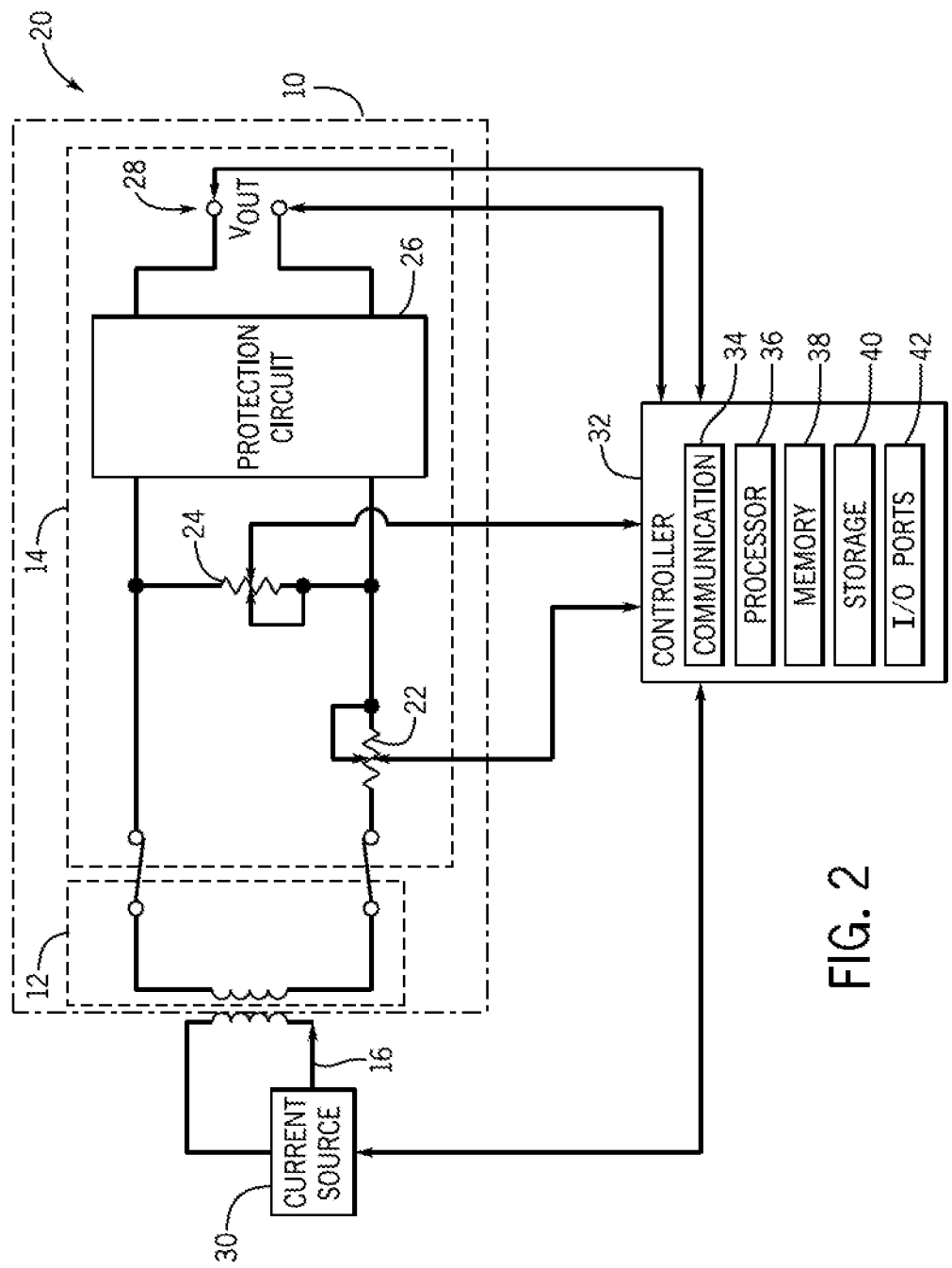
FIG. 2 illustrates an embodiment of a calibration circuit in the current transducer calibration system of FIG. 1, in accordance with aspects of the present disclosure.

The calibration circuit 14 may control the phase shift and/or the sensitivity properties of the current transducer 10 by adjusting the resistances of two variable resistors in the calibration circuit 14. For instance, FIG. 2 illustrates a circuit diagram 20 of the current transducer 10 that depicts the current sensor 12 coupled to the calibration circuit 14. As shown in FIG. 2, the calibration circuit 14 includes a phase shift resistor 22 connected in series with a sensitivity resistor 24, which may be used to control the phase shift and the sensitivity properties of the measurement output of the current transducer 10, respectively. The phase shift resistor 22 and the sensitivity resistor 24 may be variable resistors that may be adjusted to calibrate for the phase shift and the sensitivity properties of the measurement output of the current transducer 10. In certain embodiments, the phase shift resistor 22 and the sensitivity resistor 24 may be adjusted until the measurement output of the current transducer 10 substantially matches a desired or specified measurement output value. In this manner, multiple current transducers 10, each having a different current sensor 12 and a different calibration circuit 14, may be calibrated, such that each calibrated current transducer 10 may exhibit the same measurement properties even though each current transducer 10 may have different inherent inductances, capacitances, resistances, and the like. Moreover, if an operating current transducer 10 fails in the field, the calibration circuit 14 may be used to calibrate a replacement current transducer 10, such that the failed current transducer 10 may be replaced with a current transducer 10 that has the same phase shift and sensitivity properties of the current transducer 10 that is being replaced. As such, the replacement current transducer 10 may continue to provide a user or system with measurement data similar or equal to that of the previously employed current transducer 10, thereby maintaining the integrity of any subsequently collected measurement data.

In one embodiment, the calibration circuit 14 may be coupled across a secondary winding of the current sensor 12. The calibration circuit 14 may also be coupled to a protection circuit 26, which may include a number of resistors, diodes, zener diodes, and the like. The protection circuit 26 may protect the phase shift resistor 22, the sensitivity resistor 24, and the current transducer 10 from harmful signals (e.g., voltage spikes, short circuits, etc.). Moreover, the protection circuit 26 may protect additional equipment connected to the current transducer 10 or the calibration circuit 14 from excessive energy. Examples of the additional equipment may include signal-conditioning equipment, various types of monitoring devices, plant control equipment, and the like.

The calibration circuit 14 may include an output terminal 28 that may measure a voltage across the sensitivity resistor 24. The output terminal 28 may correspond to the measurement output of the current transducer 10 and may also be used to calibrate the current transducer 10. That is, the voltage waveform acquired via the output terminal 28 may be used to determine whether the phase shift or the sensitivity properties of the current transducer 10 should be adjusted to target levels, as provided by a user, model, table, or the like. Further, in certain embodiments, the resistances of the phase shift resistor 22 and the sensitivity resistor 24 may each be adjusted until the voltage waveform acquired via the output terminal 28 substantially matches a desired voltage waveform that has specified phase shift and sensitivity properties.

As mentioned above, the measurement output of the current transducer 10 may be proportional to the current I conducting through the conductor 16. Keeping this in mind, the voltage waveform acquired at the output terminal 28 is also proportional to the current I. In one embodiment, the current I may be supplied to the conductor 16 by a current source 30. The current source 30 may be an accurate current source that may provide the current I, such that the current I may accurately reflect a current value as specified or input into the current source 30. In this manner, the current transducer 10 may be accurately calibrated based on a known current value provided to the conductor 16.

Generally, the phase shift resistor 22, the sensitivity resistor 24, and the current source 30 may be controlled and operated individually by a user/operator that may use the calibration circuit 14 to calibrate the current transducer 10. However, in certain embodiments, the phase shift resistor 22, the sensitivity resistor 24, and the current source 30 may be coupled to a controller 32. The controller 32 may control the phase shift resister 22, the sensitivity resistor 24, and the current source 30 using a communication component 34, a processor 36, a memory 38, a storage 40, input/output (I/O) ports 42, and the like.

The communication component 34 may be a wireless or wired communication component that may facilitate communication between various components (e.g., current source 30) within the current transducer 10. The processor 36 may be any type of computer processor or microprocessor capable of executing computer-executable code. The memory 38 and the storage 40 may be any suitable articles of manufacture that can serve as tangible machine-readable media to store processor-executable code or instructions. These articles of manufacture may represent computer-readable media (e.g., any suitable form of memory or storage) that may store the processor-executable code executable by the processor 36 to perform presently disclosed techniques.

The controller 32 may also be coupled to the output terminal 28, such that it may monitor the voltage waveforms output by the current transducer 10. In one embodiment, the controller 32 may receive phase shift and sensitivity properties from a user and may then automatically calibrate the current transducer 10. That is, the controller 32 may specify to the current source 30 a current value to provide to the conductor 16 and may subsequently monitor the voltage waveform at the output terminal 28. The controller 32 may then calibrate the current transducer 10 by adjusting the resistances of the phase shift resistor 22 and the sensitivity resistor 24 until the voltage waveform acquired at the output terminal 28 has phase shift and sensitivity properties that substantially matches the received phase shift and sensitivity properties. Additional details with regard to a method for calibrating the current transducer 10 using the calibration circuit 14 will be described in greater detail with respect to FIG. 3 below.

Figure 3:
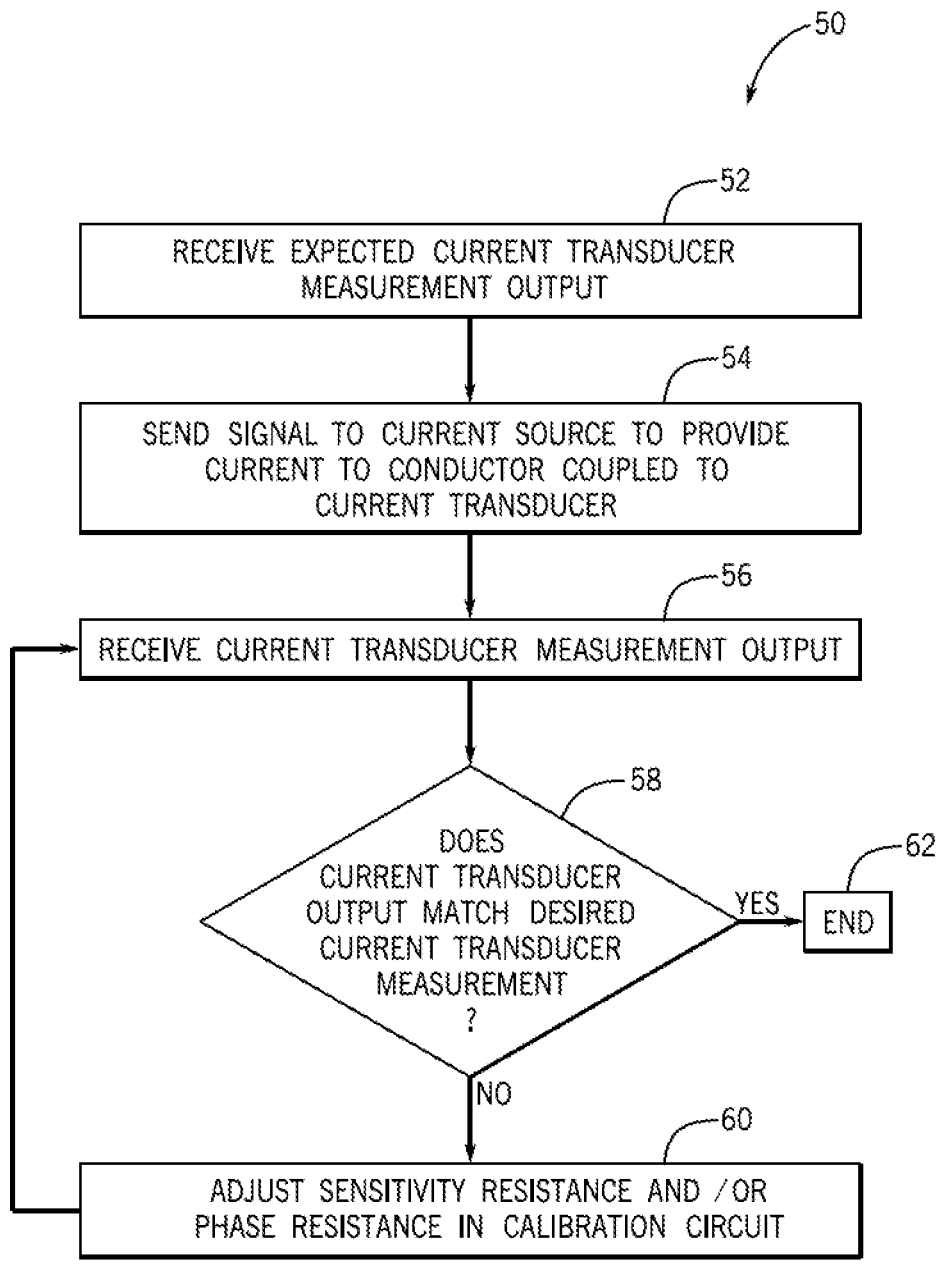
FIG. 3 is a flow chart illustrating an embodiment of a method for calibrating a current transducer using the current transducer calibration system of FIG. 1, in accordance with aspects of the present disclosure.

FIG. 3 illustrates a flow chart of a method 50 that may be employed for calibrating the current transducer 10 using the calibration circuit 14. In one example, the method 50 may be performed by the controller 32, however, it should be noted that the method 50 may also be performed by one or more users/operators who may control the resistances of the phase shift resistor 22 and the sensitivity resistor 24 as well as the current source 30 and who may monitor the voltage output at the output terminal 28.

At block 52, the controller 32 may receive an input current waveform and an expected or desired current transducer measurement output. The input current waveform may include an amplitude and frequency for a current waveform that represents current I, which may be supplied to the conductor 16 via the current source 30. In turn, the expected current transducer measurement output may correspond to an expected output value associated with the input current waveform for the current I conducting through the conductor 16 in the current transducer 10. Moreover, the current transducer measurement output may also specify a particular phase shift at which a waveform for the current transducer measurement output may shift from the waveform of the provided current I.

After receiving these values, at block 54, the controller 32 may send a signal to the current source 30 to provide the conductor 16 with the current I that corresponds to the input current waveform received at block 52. The current source 30 may then supply the conductor 16 with the appropriate current I.

At block 56, the controller 32 may receive the current transducer measurement output via the output terminal 28. In one embodiment, the controller 32 may receive a voltage waveform that may be proportional to a current waveform associated with the current I conducting through the conductor 16.

Using the expected current transducer measurement output received at block 52 and the actual current transducer measurement output received at block 56, the controller 32, at block 58, may determine whether the actual current transducer measurement output substantially matches the expected current transducer measurement output. For instance, the controller 32 may determine whether the amplitude of the actual voltage waveform matches the amplitude of the expected voltage waveform within the same degree or tolerance (e.g., less than 1%). Moreover, the controller 32 may also determine whether the actual voltage waveform is in phase with the expected voltage waveform. If either the amplitude of the actual voltage waveform does not match the amplitude of the expected voltage waveform or if the actual voltage waveform is not in phase with the expected voltage waveform, the controller 32 may proceed to block 60.

At block 60, the controller 32 may send a signal to the phase shift resistor 22, the sensitivity resistor 24, or both, to adjust their respective resistances such that the amplitude and the phase of the actual voltage waveform acquired at the output terminal 28 matches the amplitude and the phase of the expected voltage waveform. In one embodiment, the controller 32 may adjust the resistances of the phase shift resistor 22 and the sensitivity resistor 24 according to the transfer function of Equation 1, as shown below:

$$\frac{\overline{V}_o}{\overline{I}_t} = \frac{N_P}{N_s}\left[\frac{\omega^2 L_m^2 R_L}{(R_S + R_F + R_L)^2 + (\omega L_m)^2} + \frac{j\omega L_m R_L(R_S + R_F + R_L)}{(R_S + R_F + R_L)^2 + (\omega L_m)^2}\right] \quad (1)$$

where $\overline{V}_o$ corresponds to the actual voltage acquired at the output terminal 28, $\overline{I}_t$ corresponds to the current I conducting via the conductor 16, $N_p$ corresponds to the number of primary windings in the current transducer calibration system 10, $N_S$ corresponds to the number of secondary winding in the current transducer 12, $\omega$ corresponds to the angular frequency of the current I, $L_m$ corresponds to the inductance of the current transducer 12, $R_S$ corresponds to the resistance of the windings in the current transducer 12, $R_F$ corresponds to the resistance of the phase shift resistor 22, and $R_L$ corresponds to the sensitivity resistor 24.

Moreover, the phase angle may be characterized according to Equation 2, as shown below:

$$\theta(\text{phase angle}) = \text{Arctan}\left(\frac{R_S + R_F + R_L}{\omega L_m}\right) \quad (2)$$

As such, the controller 32 may adjust the resistances of the phase shift resistor 22 and the sensitivity resistor 24 based on the actual voltage acquired via the output terminal 28 and Equations 1 and 2. Afterwards, the controller 32 may then proceed back to block 56 and receive an updated current transducer measurement output and continuously perform blocks 56, 58, and 60 until the actual voltage waveform acquired via the output terminal 28 substantially matches the expected voltage waveform (e.g., less than 1% difference). As such, the controller 32 may adjust the resistances of the phase shift resistor 22 and the sensitivity resistor 24 until the actual voltage waveform substantially matches the expected voltage waveform.

Referring back to block 58, when the actual voltage waveform matches the expected voltage waveform, the controller 32 may proceed to block 62 and end the method 50. That is, since the actual voltage waveform matches the expected voltage waveform at block 62, the current transducer 10 may be considered calibrated as per the parameters received at block 52. In certain embodiments, the method 50 may be performed on a number of current transducers soon after being manufactured. As such, each of the manufactured current transducers may exhibit substantially similar phase shift and sensitivity properties. As a result, current transducers may be manufactured using lower cost components (e.g., interchangeable) since their effects to the capacitance, inductance, and the resistance of the current transducer may be compensated for using the calibration circuit 14.

Further, as mentioned above, one challenging aspect related to using the current transducer 10 may include accurately measuring a leakage current of stator windings of a motor or generator in real-time. Excessive leakage current in the stator windings may cause damage to the motor or generator. However, leakage current is a complex signal that includes an amplitude and phase (i.e., relative to motor's line voltage) and real (e.g., resistive) and imaginary (e.g., capacitive) components, and its signal level may be very low as compared to the signal of the motor's line current. Therefore, a current sensor with high accuracy and performance may be useful in consistently acquiring accurate leakage current measurements.

By employing the calibration circuit 14 described above, a number of similarly designed current transducers may consistently output similar or equal measurement values for the same input currents. That is, the calibration circuit 14 may calibrate different toroidal-type current transducers 10 that may have high tolerance levels in their electrical (e.g., resistance) and magnetic (e.g., inductance) properties due to the magnetic properties of the materials and manufacturing process used to create them. Moreover, the calibration circuit 14 may compensate for a phase shift between an output signal of the current transducer 10 and a measured leakage current. Therefore, the calibration circuit 14 described above may enable current transducers 10 to be manufactured with a much larger variation in component specifications. As a result, the manufacturing cost related to producing the current transducer may decrease and each current transducer 10 may be calibrated to meet more stringent performance specifications.

In addition to using the calibration circuit 14 to manufacture current transducers 10 having similar output measurement values, a solid-side shield may be used to consistently shield each manufactured current transducer 10. In some embodiments, one or more of the shields may have been tape-wound shields, which consist of tape wound in layers to create a substantially solid object. Both the use of solid-side shields and the use of tape-wound shields will be discussed in greater detail below.

Figure 4:
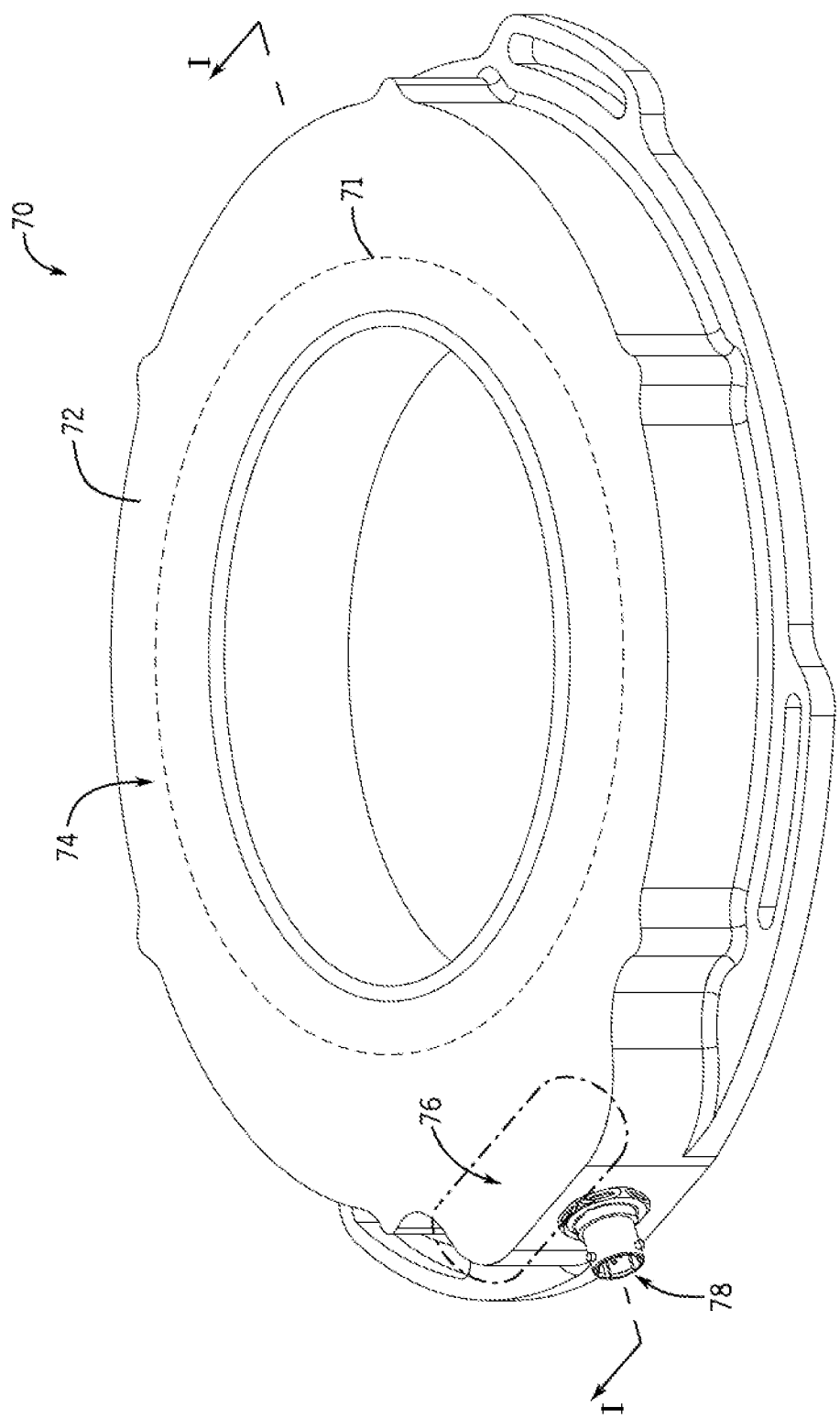
FIG. 4 illustrates a top perspective view of an embodiment of a housing for a shield to shield a current transducer in the current transducer calibration system of FIG. 1, in accordance with aspects of the present disclosure.

Keeping this in mind FIG. 4 illustrates a top perspective view of a solid-side shield assembly 70. The solid-side shield assembly 70, in one embodiment, may include a housing 72 that may generally form an annular shape 71 and may include an annular cavity 74 that may fit a magnetically permeable material used to shield the current transducer 10. The magnetically permeable material may absorb magnetic fields. In certain embodiments, the magnetically permeable material is such that its permeability may be measured with respect to free space.

The housing 72 may be composed of plastic, aluminum, any polymer, fiberglass, non-ferrite metals, or the like. In one embodiment, the housing 72 may include an extended cavity 76 that may enclose the calibration circuit 14. As such, the housing 72 may also include connector pins 78 that may be used to provide access to the output terminal 28 of the calibration circuit 14, which may enable a user to calibrate the current transducer 10 via the calibration circuit 14.

Figure 5:
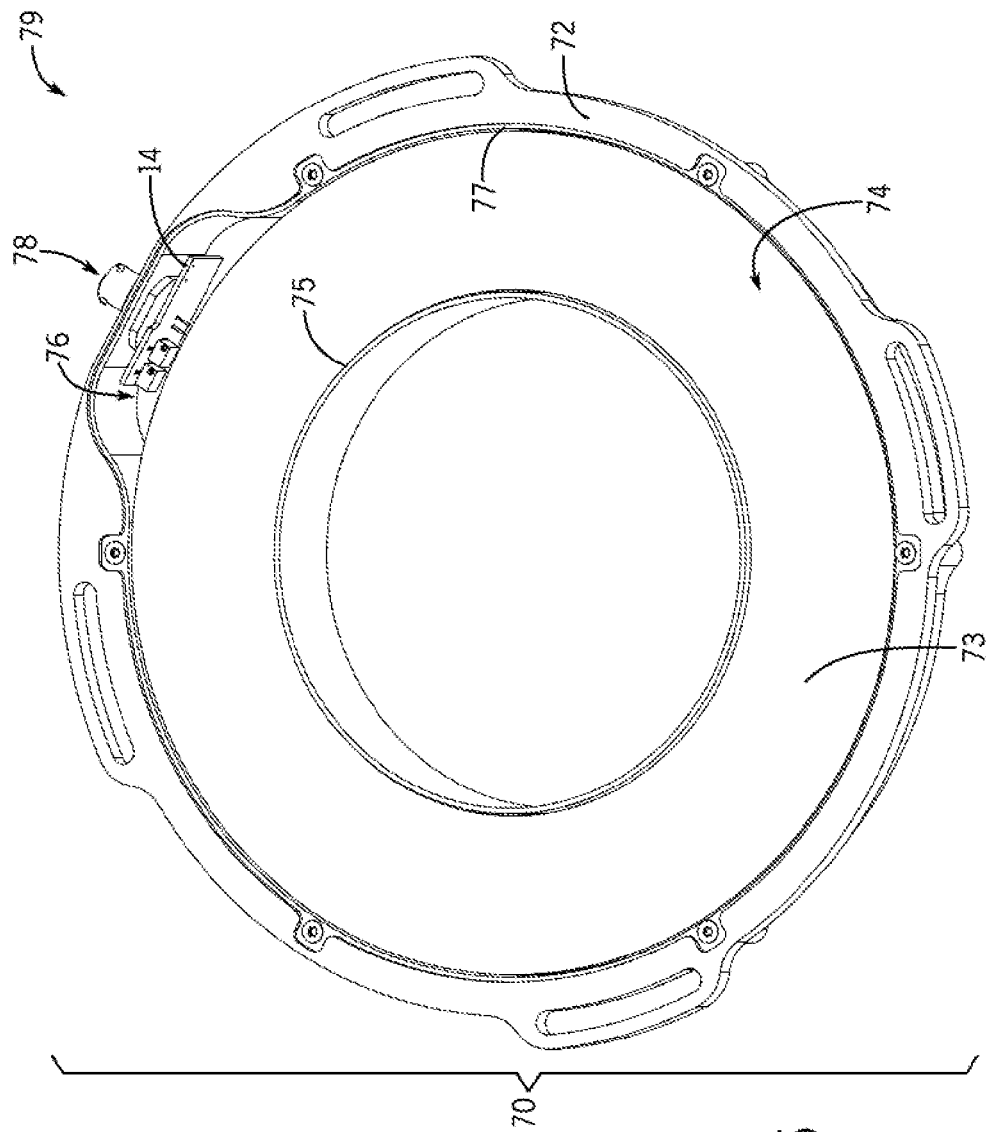
FIG. 5 illustrates an inside view of an embodiment of the housing of FIG. 4, in accordance with aspects of the present disclosure.

Keeping this in mind, FIG. 5 illustrates the annular cavity 74 and the extended cavity 76 from an inside view 79 of the housing 72. The housing 72 may include a base 73, an inner annular cavity wall 75 and an outer annular cavity wall 77. As such, the annular cavity 74 may encompass the space between the base 73, the inner annular cavity wall 75, and the outer annular cavity wall 77. Generally, the housing 72 may be formed, such that the base 73, the inner annular cavity wall 75, and the outer annular cavity wall 77 may be composed of the same material and formed from one piece of that material. In one embodiment, the calibration circuit 14 may fit inside the outer annular cavity wall 77 within the extended cavity 76, such that it may be accessed via connector pins 78, which may enable wires, cables, and the like access to the calibration circuit 14.

Figure 6:
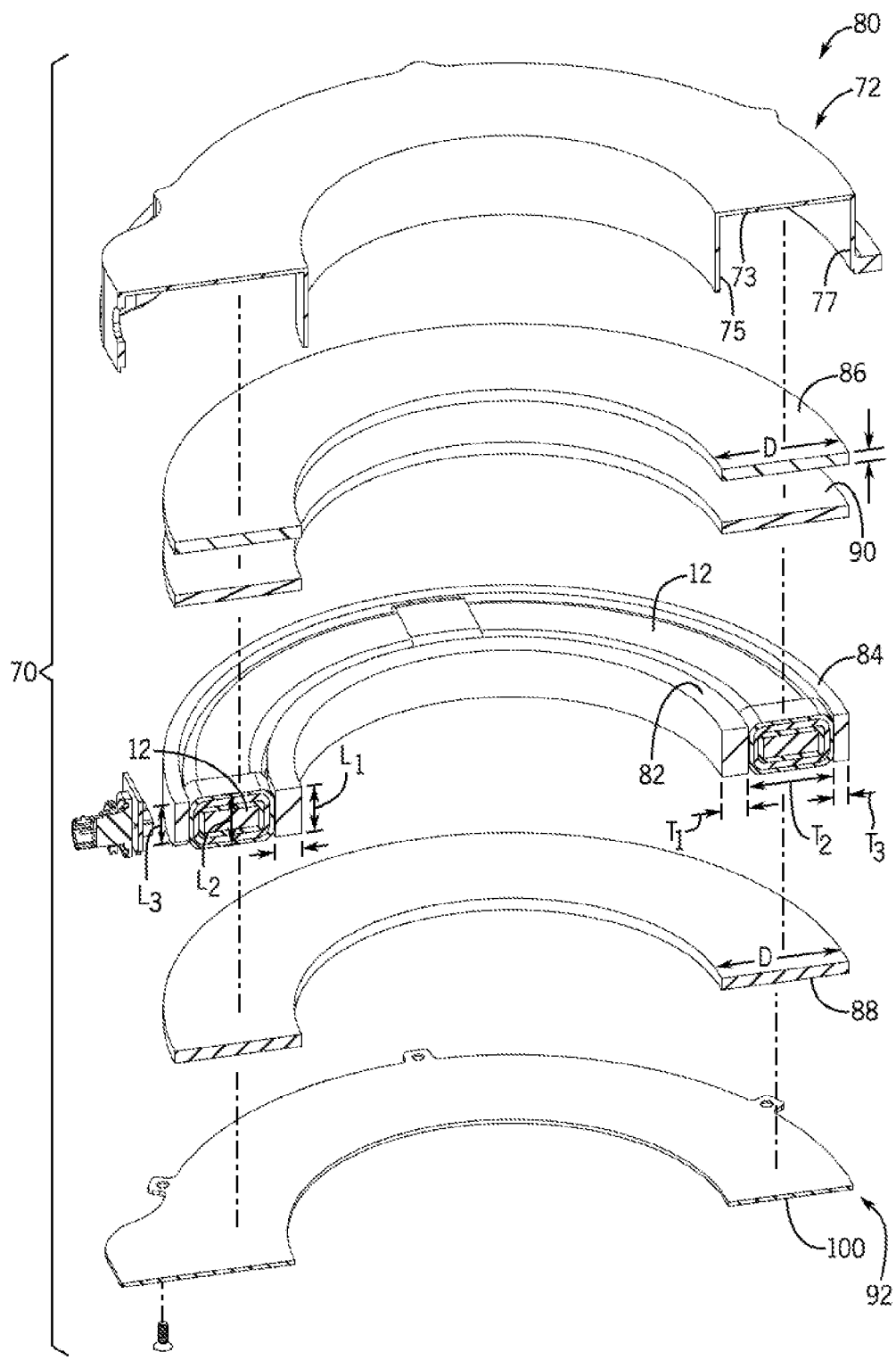
FIG. 6 illustrates an exploded view of an embodiment of the shield assembly of FIG. 4, in accordance with aspects of the present disclosure.

As mentioned above, the annular cavity 74 may fit four annular rings, such that each annular ring may shield one side of the current sensor 12. FIG. 6 illustrates a cross-sectional exploded view 80 of the solid-side shield assembly 70 cut vertically down line I in FIG. 4. In particular, FIG. 6 depicts how each annular ring may fit around the current sensor 12. As shown, the solid-side shield assembly 70 may include an inner radial ring 82 (e.g., radially inner ring or disc), an outer radial ring 84 (e.g., radially outer ring or disc), a top axial ring 86 (e.g., axially upper ring or disc), and a bottom axial ring 88 (e.g., axially lower ring or disc). The inner radial ring 82 and the outer radial ring 84 may be radially spaced apart from one another, and the top axial ring 86 and the bottom axial ring 88 may be axially spaced apart from one another. Additionally, the inner radial ring 82 and the outer radial ring 84 may be concentric with one another.

In one embodiment, a radial distance D between the inner and outer radii of the top axial ring 86 and the bottom axial ring 88 may be approximately equal to or greater than a radial thickness T1 of the inner radial ring 82 plus a radial thickness T2 of the current sensor 12 plus a radial thickness T3 of the outer radial ring 84. As such, the top axial ring 86 and the bottom axial ring 88 may effectively shield the top and bottom portions of the current sensor 12 from electrical or magnetic noise that may be present outside the housing 72.

Referring back to the inner radial ring 82 and the outer radial ring 84, a length L1 (e.g., axial height) of the inner radial ring 82 and a length L3 (e.g., axial height) of the outer radial ring 84 may be approximately equal to or greater than the length L2 (e.g., axial height) of the current sensor 12. As such, the inner and outer radii of the current sensor 12 may be effectively shielded from electrical or magnetic noise that may be present outside the housing 72. In combination, the inner radial ring 82, the outer radial ring 84, the top axial ring 86, and the bottom axial ring 88 may shield each side of the current sensor 12, such that the entire current sensor 12 is effectively shielded from various magnetic and electrical noise sources.

In certain embodiments, the inner radial ring 82, the outer radial ring 84, the top axial ring 86, and the bottom axial ring 88 may each be composed of a magnetically permeable material, such that its permeability may be measured with respect to free space, such as a Supermalloy (e.g., nickel-iron alloy), Metglas®, Ultraperm, MuMETAL®, or the like. As such, the inner radial ring 82, the outer radial ring 84, the top axial ring 86, and the bottom axial ring 88 may each be solid pieces of material fabricated to precise measurements using a laser cutter, a water jet cutter, or the like. Generally, the thickness of the inner radial ring 82, the outer radial ring 84, the top axial ring 86, and the bottom axial ring 88 may be at least 0.075 inches. In certain embodiments, the inner radial ring 82, the outer radial ring 84, the top axial ring 86, or the bottom axial ring 88 may include several pieces stacked on top of each other to form a complete inner radial ring 82, outer radial ring 84, top axial ring 86, or bottom axial ring 88. That is, for example, the top axial ring 86 may be composed of 10 pieces of the magnetically permeable material each 0.0075 inches thick and stacked on top of each other to form a 0.075 inch top axial ring 86.

Further, as mentioned above, certain current transducers 10 may use tape-wound shields for at least one of the inner radial ring 82, the outer radial ring 84, the top axial ring 86, or the bottom axial ring 88. In particular, both the inner radial ring 82 and the outer radial ring 84 may be tape-wound shields in certain embodiments. The tape-wound shields may be made of a magnetically permeable material such as a silicon-iron alloy (e.g., VITROPERM®). The magnetically permeable material may be wound to form a certain amount of layers (e.g., at least 100, at least 200, etc.). Using tape-wound shields may reduce the magnitude of eddy currents generated (i.e., may reduce energy lost within the magnetically permeable material) during operation of the current transducer 10, which in turn may increase the accuracy of the current sensor 12. Further, the tape-wound shields may also have an increased permeability relative to the solid shields.

As mentioned above, the inner radial ring 82, the outer radial ring 84, the top axial ring 86, and the bottom axial ring 88 may effectively shield the entire current sensor 12 from electrical or magnetic noise outside the housing 72. Additionally, the inner radial ring 82, the outer radial ring 84, the top axial ring 86, and the bottom axial ring 88 may also form an electrically conductive shell around the current sensor 12, as magnetically permeable materials tend to have a high conductance. However, the electrical and magnetic shields may also interfere with and even attenuate the magnetic fields caused by the currents the current sensor 12 is intended to measure (e.g., the current I).

To consistently reduce attenuation of the magnetic fields the current sensor 12 should measure, the solid-side shield assembly 70 may include an isolating ring 90, as shown in FIG. 6. The isolating ring 90 disrupts the electrical continuity of the electrically conductive shell, and may interrupt the electrically conductive shell at any section of the solid-side shield assembly 70. In certain embodiments, the isolating ring 90 may provide electrical isolation around the entire perimeter of one or more of the annular shielding rings and around the entire circumference of the current sensor 12. Alternately, the isolating ring 90 may provide electrical isolation for differing amounts of the circumference of the current sensor 12 (e.g., 25%, 30%, 50%, etc.) In embodiments in which the isolating ring 90 provides electrical isolation for a portion of the circumference of the current sensor 12, the isolating ring 90 may provide electrical isolation in one section or may be composed of several pieces disposed around the circumference of the current sensor 12 (e.g., evenly spaced around the current sensor 12).

The isolating ring 90 may be composed of an electrically insulating material, such as a polypropylene material. Further, it may be desirable to restrict the isolating ring 90 to a minimal size in order to preserve the continuity of the magnetic shields created by the inner radial ring 82, the outer radial ring 84, the top axial ring 86, and the bottom axial ring 88. For example, in certain embodiments, the isolating ring 90 may have a thickness ranging from 1 micrometer to 20 millimeters. In other embodiments, the isolating ring 90 may have a thickness as little as 1 nanometer.

As depicted in FIG. 6, the isolating ring 90 is disposed between the inner radial ring 82, the outer radial ring 84, and the top axial ring 86. In particular, the isolating ring 90 is a one-piece structure that has the same shape as the top axial ring 86. Alternately or additionally, the isolating ring 90 may be disposed between the inner radial ring 82, the outer radial ring 84, and the bottom axial ring 88. In other embodiments, the isolating ring 90 may be disposed between the inner radial ring 82 and the top axial ring 86, while other material (e.g., potting material) is disposed between the outer radial ring 84 and the top axial ring 86, or vice versa. Alternately or additionally, the isolating ring 90 may be disposed between the inner radial ring 82 and the bottom axial ring 88, while other material (e.g., potting material) is disposed between the outer radial ring 84 and the bottom axial ring 88, or vice versa.

In certain embodiments, the additional material (e.g., potting material), may not be used. For example, the isolating ring 90 may be disposed between the inner radial ring 82 and the top axial ring 86, while the outer radial ring 84 and the top axial ring 86 make electrical contact, or vice versa. Alternately or additionally, the isolating ring 90 may be disposed between the inner radial ring 82 and the bottom axial ring 88, while the outer radial ring 84 and the bottom axial ring 88 make electrical contact, or vice versa. In such embodiments, the isolating ring 90 may have the same shape as the inner radial ring 82 or the outer radial ring 84, depending on its location. Using the combination of the isolating ring 90 and any additional material (e.g., potting material) may depend on the thickness of each material relative to the other, and the dimensions of the magnetic shield components (i.e., the inner radial ring 82, the outer radial ring 84, the top axial ring 86, and the bottom axial ring 88).

In certain embodiments of the solid-side shield assembly 70, two or three of the inner radial ring 82, the outer radial ring 84, the top axial ring 86, and the bottom axial ring 88 may be formed as a single piece. That is, two or three of the inner radial ring 82, the outer radial ring 84, the top axial ring 86, and the bottom axial ring 88 may be fabricated from the magnetically permeable material, such that two or three of the inner radial ring 82, the outer radial ring 84, the top axial ring 86, and the bottom axial ring 88 are formed together. For instance, the inner radial ring 82 and the bottom axial ring 88 may be fabricated from a single piece of the magnetically permeable material, thereby forming a first single shielding piece. In the same manner, the outer radial ring 84 and the top axial ring 86 may be fabricated from a single piece of the magnetically permeable material, thereby forming a second single shielding piece. Both of these pieces may then be positioned around the current sensor 12, such that the current sensor 12 may be shielded on each of its sides. In the same manner, the inner radial ring 82, the outer radial ring 84, and the top axial ring 86 may be fabricated from a single piece of the magnetically permeable material, thereby forming a single shielding piece that may fit around three sides of the current sensor 12. The bottom axial ring 88 may then be positioned on top of the resulting three-sided shielding piece to shield the current sensor 12 from noise in each direction. For these particular embodiments, the isolating ring 90 may still have the same shape as the top axial ring 86 or the bottom axial ring 88, as depicted in FIG. 6. Alternatively, in other embodiments, the isolating ring 90 may have the same shape as the inner radial ring 82 or the outer radial ring 84 depending on its location, as described above.

The housing 72 may also include a lid 92. The lid 92 may be coupled to the inner annular cavity wall 75, the outer annular cavity wall 77, the inner radial ring 82, the outer radial ring 84, the top axial ring 86, or the bottom axial ring 88 using fasteners such as screws and the like. Once the housing 72 is fastened together using the lid 92, the solid-side shield assembly 70 may effectively shield the current transducer 10 from electrical or magnetic noise that may be present outside the housing 72.

As stated above, the housing 72 may be composed of conductive materials, such as aluminum. In some embodiments, the lid 92 may be coupled to the outer annular cavity wall 77 to prevent the housing 72 from forming an electrically conductive shell around the current sensor 12. That is, the outer radius of the lid 92 may be greater than the radius of the outer annular cavity wall 77, such that there is a material and electrical overlap and an electrical connection between the lid 92 and the outer annular cavity wall 77. In these embodiments, the inner radius of the lid 92 may be greater than the radius of the inner annular cavity wall 75, such that there is no electrical contact at that point, which disrupts the electrical continuity of the electrically conductive shell formed by the housing 72.

Figure 7:
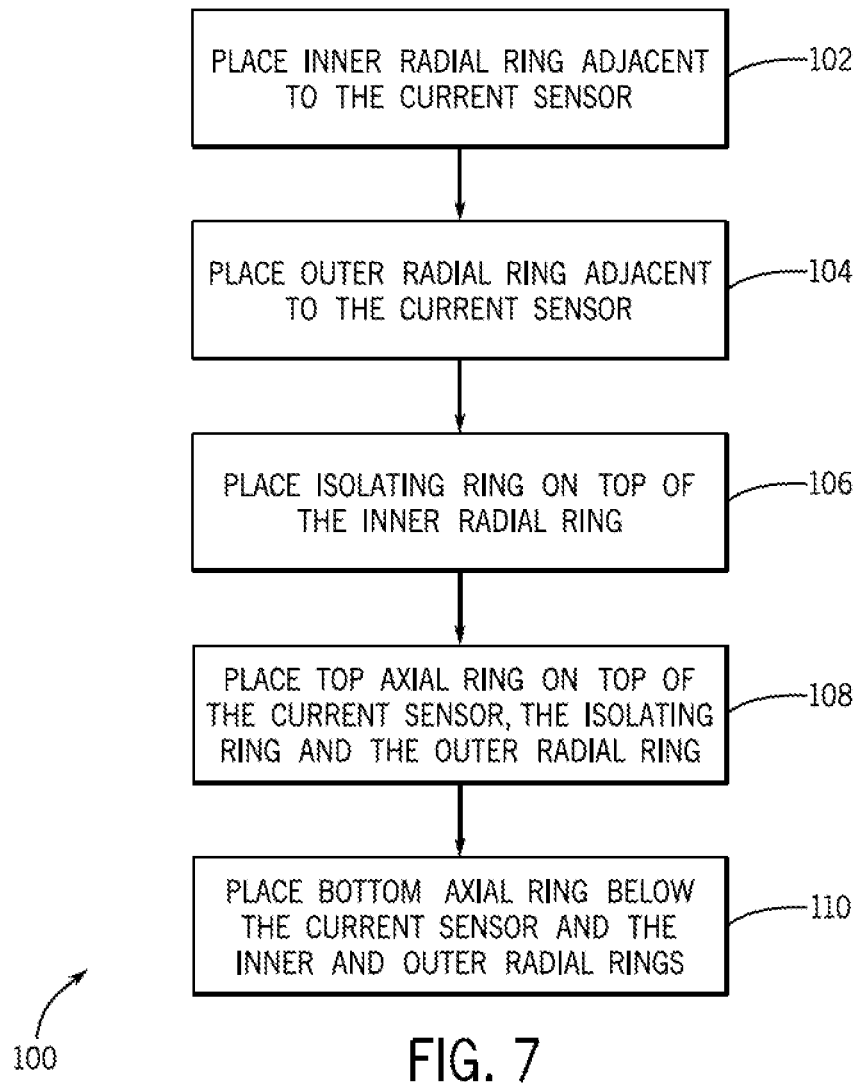
FIG. 7 is a flow chart illustrating an embodiment of a method for assembling the shield assembly of FIG. 6, in accordance with aspects of the present disclosure.

FIG. 7 depicts a block diagram of a method 100 for assembling the solid-side shield assembly 70 illustrated in FIG. 6. Although the method 100 is described below in detail, the method 100 may include other steps not shown in FIG. 7, and the steps illustrated may be performed in a different order or concurrently.

Beginning at block 102, the inner radial ring 82 may be placed adjacent to the current sensor 12. Next, at block 104, the outer radial ring 84 may be placed adjacent to the opposite side of the current sensor 12. As mentioned above, the inner radial ring 82 and the outer radial ring 84 may be arranged such that they are concentric with one another.

At block 106, the isolating ring 90 may be placed on top of the inner radial ring 82. Alternately or additionally, the isolating ring 90 may be placed on top of the outer radial ring 84. For example, in some embodiments, the isolating ring 90 may be a one-piece structure that spans both the inner radial ring 82 and the outer radial ring 84. As mentioned above, for embodiments in which the isolating ring 90 is placed on top of only one radial ring, additional material (e.g., potting material) may be placed or deposited on top of the radial ring not covered by the isolating ring 90.

After installing the isolating ring 90, the top axial ring 86 may be placed on top of the isolating ring 90, the current sensor 12, and the outer radial ring 84 at block 108. In some embodiments, the isolating ring 90 may span the inner radial ring 82 and the outer radial ring 84, and the top axial ring 86 may be placed on top of the isolating ring 90, as noted above. Finally, at block 110, the bottom axial ring 88 may be placed below the current sensor 12, the inner radial ring 82, and the outer radial ring 84. In some embodiments, an isolating ring 90 may be placed between the bottom axial ring 88 and at least one of the inner radial ring 82 and the outer radial ring 84.

As will be appreciated, the method 100 may also include other steps not described above. For example, the method 100 may include placing the assembled device in a housing, or electrically coupling the current sensor 12 to the connector pins 78. In other embodiments, the method 100 may include placing the assembled device in a housing 72 and depositing potting material to stabilize the internal components of the device.

Figure 8:
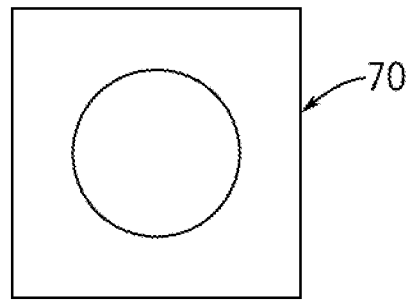
FIG. 8 illustrates a top view of a square-shaped embodiment of the shield assembly of FIG. 4, in accordance with aspects of the present disclosure.

Although the solid-side shield assembly 70 has been described as having an annular-shaped housing 72, annular-shaped lid 92, and four annular shielding rings (i.e., inner radial ring 82, outer radial ring 84, top axial ring 86, and bottom axial ring 88), it should be noted that the solid-side shield assembly 70 may also be formed in other shapes, such that the current transducer 10 may fit within the solid-side shield assembly 70. By way of example, the solid-side shield assembly 70 may have a square-shaped outer edge and an annular-shaped inner edge, as depicted in FIG. 8. As such, the annular-shaped housing 72, the annular-shaped lid 92, the outer radial ring 84, the top axial ring 86, and the bottom axial ring 88, as depicted in FIG. 6, may be formed such that each aforementioned piece may have a square-shaped outer edge and an annular shaped inner edge, while the annular ring 82 may have annular-shaped inner and outer edges.

Figure 9:
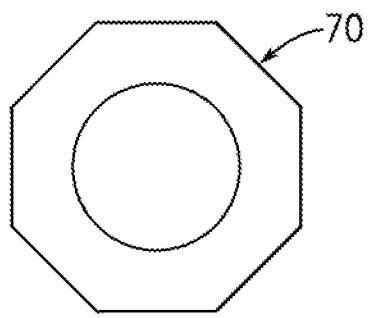
FIG. 9 illustrates a top view of an octagonal-shaped embodiment of the shield assembly of FIG. 4, in accordance with aspects of the present disclosure.
Figure 10:
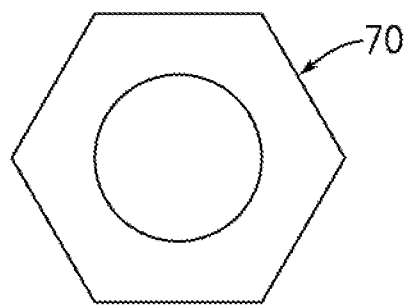
FIG. 10 illustrates a top view of a hexagonal-shaped embodiment of the shield assembly of FIG. 4, in accordance with aspects of the present disclosure.

In another example, the solid-side shield assembly 70 may have an octagonal-shaped outer edge and an annular-shaped inner edge, as depicted in FIG. 9, or a hexagonal-shaped outer edge and an annular-shaped inner edge, as depicted in FIG. 10. In this manner, the annular-shaped housing 72, the annular-shaped lid 92, the outer radial ring 84, the top axial ring 86, and the bottom axial ring 88, as depicted in FIG. 6, may have outer edges formed according to the shapes of the outer edges in FIGS. 8 and 9, while the inner radial ring 82 may have annular-shaped inner and outer edges. Further, in embodiments similar to those depicted in FIGS. 8-10, the isolating ring 90 may provide electrical isolation around the entire perimeter of one or more of the annular shielding rings and around the entire circumference of the current sensor 12.

As mentioned above, the isolating ring 90 may disrupt the continuity of the electrically conductive shell generated by the four annular rings. By disrupting the continuity of the electrically conductive shell, the isolating ring 90 may reduce the attenuation of the magnetic fields associated with the currents the current sensor 12 is intended to measure (e.g., current I). As a result, the current sensor 12 may make more reliable and accurate measurements, particularly in applications where the current transducer 10 is used to measure very small currents. Further, using a component (i.e., the isolating ring 90) to provide consistent electrical isolation in turn may consistently reduce attenuation in the current transducer 10. This may allow the current transducer 10 to be built consistently and may increase the reliability and accuracy of the device throughout its life-cycle.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A device, comprising:
   a first axial ring;
   a first radial ring disposed below the first axial ring in an axial direction;
   a second radial ring disposed below the first axial ring in the axial direction, wherein the first radial ring and the second radial ring are spaced apart in a radial direction perpendicular to the axial direction;
   an electrically non-conductive isolating ring disposed between the first axial ring and the first radial ring;
   a current sensor disposed between the first radial ring and the second radial ring; and
   a second axial ring disposed below the first radial ring, the second radial ring, and the current sensor;
   wherein the first axial ring, the first radial ring, the second radial ring, and the second axial ring form a magnetic shield and
   wherein the isolating ring disrupts electrical continuity of the first axial ring, the first radial ring, the second radial ring, and the second axial ring.

2. The device of claim 1, wherein the first radial ring has a first perimeter, the isolating ring has a second perimeter, and the first perimeter is equal to the second perimeter.

3. The device of claim 1, wherein a second isolating ring is disposed between the first axial ring and the second radial ring.

4. The device of claim 1, wherein the isolating ring comprises a one-piece structure spanning the first radial ring and the second radial ring.

5. The device of claim 1, comprising a potting material disposed between the first axial ring and the second radial ring.

6. The device of claim 1, comprising a plurality of current sensors.

7. The device of claim 1, comprising a second isolating ring disposed between the second axial ring and at least one of the first radial ring or the second radial ring.

8. The device of claim 1, wherein the isolating ring has a thickness between 1 micrometer and 20 millimeters.

9. The device of claim 1, wherein the isolating ring is disposed over a portion of the first radial ring.

10. A method of assembly, comprising:
disposing a first radial ring adjacent to a first surface of a current sensor;
disposing a second radial ring adjacent to a second surface of the current sensor, wherein the first surface and the second surface are on opposite sides of the current sensor, wherein the first radial ring and the second radial ring are spaced apart in a radial direction perpendicular to an axial direction;
disposing an isolating ring on top of the first radial ring in the axial direction;
disposing a first axial ring on top of the first radial ring, the current sensor, and the isolating ring in the axial direction; and
disposing a second axial ring below the first radial ring, the current sensor, and the second radial ring in the axial direction.

11. The method of assembly of claim 10, wherein comprising disposing the isolating ring on top of the second radial ring.

12. The method of assembly of claim 10, wherein comprising disposing a potting material on top of the second radial ring.

13. The method of assembly of claim 10, comprising disposing a second isolating ring below at least one of the first radial ring or the second radial ring and above the second axial ring.

14. A system, comprising:
a device comprising:
a housing;
a first axial ring disposed in the housing;
a first radial ring disposed on top of the first axial ring in an axial direction;
a second radial ring disposed on top of the first axial ring in the axial direction, wherein the first radial ring and the second radial ring are spaced apart in a radial direction perpendicular to the axial direction;
a current sensor disposed in between the first radial ring and the second radial ring;
an isolating ring disposed on top of the first radial ring;
a second axial ring disposed on top of the first radial ring, the current sensor, and the isolating ring;
a lid disposed above the second axial ring and coupled to the housing to form a non-conductive shell; and
a plurality of connector pins electrically coupled to the current sensor and disposed in the housing;
wherein the first axial ring, the first radial ring, the second radial ring, and the second axial ring form a magnetic shield and
wherein the isolating ring disrupts electrical continuity of the first axial ring, the first radial ring, the second radial ring, and the second axial ring.

15. The system of claim 14, wherein the isolating ring and the second axial ring have substantially the same shape.

16. The system of claim 14, wherein the isolating ring has a first perimeter, the first radial ring has a second perimeter, and the first perimeter is equal to the second perimeter.

17. The system of claim 14, comprising calibration circuitry electrically coupled to the plurality of connector pins and configured to calibrate the measurement output of the current sensor.

18. The system of claim 17, comprising protection circuitry electrically coupled to at least one of the calibration circuitry or the plurality of connector pins and configured to protect at least one of the calibration circuitry or the current sensor from harmful signals.

19. The system of claim 14, wherein at least one of the first radial ring or the second radial ring comprises a tape-wound shield.

20. The system of claim 14, wherein the current sensor comprises a sensor core and a coil disposed around the entirety of the sensor core.

* * * * *